(12) United States Patent
Choyikkunnil et al.

(10) Patent No.: US 11,229,140 B2
(45) Date of Patent: Jan. 18, 2022

(54) DEVICE CARRIERS

(71) Applicant: Seagate Technology LLC, Cupertino, CA (US)

(72) Inventors: Anil Koyad Choyikkunnil, Bangalore (IN); Shankar Gopalakrishna, Bangalore (IN); Saju Cheeran Verghese Francis, Bangalore (IN); Kiran Padmakumari Devapalan, Bangalore (IN)

(73) Assignee: Seagate Technology LLC, Fremont, CA (US)

( * ) Notice: Subject to any disclaimer, the term of this patent is extended or adjusted under 35 U.S.C. 154(b) by 485 days.

(21) Appl. No.: 15/824,816

(22) Filed: Nov. 28, 2017

(65) Prior Publication Data
US 2019/0166714 A1    May 30, 2019

(51) Int. Cl.
| | | |
|---|---|---|
| H05K 7/18 | (2006.01) | |
| H05K 7/14 | (2006.01) | |
| H05K 5/02 | (2006.01) | |
| G11B 33/12 | (2006.01) | |

(52) U.S. Cl.
CPC .......... *H05K 7/183* (2013.01); *G11B 33/124* (2013.01); *G11B 33/128* (2013.01); *H05K 5/02* (2013.01); *H05K 7/14* (2013.01)

(58) Field of Classification Search
None
See application file for complete search history.

(56) References Cited

U.S. PATENT DOCUMENTS

| | | | | |
|---|---|---|---|---|
| 5,277,615 A | * | 1/1994 | Hastings | G06F 1/181 361/679.32 |
| 5,325,263 A | * | 6/1994 | Singer | G06F 1/184 361/679.39 |
| 5,438,476 A | * | 8/1995 | Steffes | G06F 1/184 312/223.2 |
| 5,442,513 A | * | 8/1995 | Lo | G11B 33/027 361/679.35 |
| 5,507,650 A | * | 4/1996 | Larabell | G06F 1/184 439/61 |
| 5,784,644 A | * | 7/1998 | Larabell | G06F 13/409 710/14 |
| 5,921,644 A | * | 7/1999 | Brunel | G11B 33/124 312/223.2 |
| 6,560,099 B1 | * | 5/2003 | Chang | G11B 33/122 361/679.33 |
| 6,743,054 B2 | * | 6/2004 | Wu | G11B 33/122 439/61 |

(Continued)

OTHER PUBLICATIONS

U.S. Appl. No. 15/356,920, filed Nov. 21, 2016, Seagate Technology LLC.

*Primary Examiner* — Xanthia C Cunningham
(74) *Attorney, Agent, or Firm* — Mueting Raasch Group

(57) ABSTRACT

Carriers may be adapted, or configured, to allow devices received thereby to move towards and away from an interface end region. When devices are positioned proximate the interface end region of the carriers, interfaces of the devices may be presented by the carriers for operable coupling to an enclosure. When devices are positioned away from the interface end region of the carriers, interface adapters may be coupled to the interfaces of the devices, which may present a different interface for operable coupling to an enclosure.

5 Claims, 20 Drawing Sheets

(56) References Cited

U.S. PATENT DOCUMENTS

| | | | |
|---|---|---|---|
| 6,798,650 B2* | 9/2004 | Reznikov | G11B 33/122 312/223.1 |
| 6,876,547 B2* | 4/2005 | McAlister | G06F 1/184 250/216 |
| 7,251,132 B1* | 7/2007 | Paul | G06F 1/187 248/618 |
| 7,379,294 B2* | 5/2008 | Chen | G06F 1/187 165/122 |
| 7,423,868 B2* | 9/2008 | Mihara | G06F 1/1616 248/634 |
| 7,515,410 B1 | 4/2009 | Dingfelder et al. | |
| 7,559,782 B2* | 7/2009 | Yuh | G11B 33/121 361/754 |
| 7,639,492 B2* | 12/2009 | Thomas | G06F 1/187 361/679.33 |
| 8,045,326 B1* | 10/2011 | Reznikov | G06F 1/187 312/223.1 |
| 8,050,027 B2* | 11/2011 | Liang | G06F 1/187 361/679.37 |
| 8,251,339 B2* | 8/2012 | Peng | G11B 33/124 248/682 |
| 8,286,922 B2 | 10/2012 | Chou et al. | |
| 8,406,003 B2* | 3/2013 | Zhang | G06F 1/187 361/679.39 |
| 8,456,832 B1 | 6/2013 | Brigham, Jr. et al. | |
| 8,462,495 B1 | 6/2013 | Keefe et al. | |
| 8,508,928 B2 | 8/2013 | Killen et al. | |
| 8,749,966 B1* | 6/2014 | Boudreau | G06F 1/187 361/679.33 |
| 8,817,460 B2 | 8/2014 | Yu et al. | |
| 9,420,718 B2 | 8/2016 | Du et al. | |
| 9,433,118 B2* | 8/2016 | Senatori | G06F 1/186 |
| 9,625,960 B1 | 4/2017 | Ent et al. | |
| 9,691,435 B2 | 6/2017 | Ehlen | |
| 9,703,333 B1* | 7/2017 | Harting | G06F 1/187 |
| 9,733,678 B2* | 8/2017 | Chen | G06F 1/18 |
| 9,746,887 B2 | 8/2017 | Lai | |
| 10,056,118 B2* | 8/2018 | Lu | G11B 33/124 |
| 2003/0206402 A1* | 11/2003 | Tsuyuki | G11B 33/128 361/725 |
| 2006/0056146 A1* | 3/2006 | Marcade | G06F 1/187 361/679.32 |
| 2008/0013272 A1* | 1/2008 | Bailey | G06F 1/187 361/679.33 |
| 2008/0168257 A1* | 7/2008 | Marks | G06F 3/0607 712/38 |
| 2009/0091884 A1* | 4/2009 | Walker | G06F 1/187 361/679.37 |
| 2009/0103252 A1* | 4/2009 | Peng | G11B 33/123 361/679.4 |
| 2009/0129009 A1* | 5/2009 | Zhang | G11B 33/12 361/679.34 |
| 2011/0049319 A1* | 3/2011 | Peng | G06F 1/187 248/309.1 |
| 2011/0234060 A1* | 9/2011 | Wu | G11B 33/128 312/111 |
| 2011/0267764 A1* | 11/2011 | Wilke | G06F 1/187 361/679.33 |
| 2012/0147545 A1 | 6/2012 | Niu et al. | |
| 2012/0218705 A1* | 8/2012 | Huang | G06F 1/187 361/679.37 |
| 2012/0300384 A1* | 11/2012 | Alo | G06F 1/187 361/679.31 |
| 2013/0058033 A1 | 3/2013 | Hu et al. | |
| 2013/0277513 A1 | 10/2013 | Pan et al. | |
| 2013/0314868 A1* | 11/2013 | Tsai | G11B 33/124 361/679.33 |
| 2014/0293523 A1* | 10/2014 | Jau | H05K 7/1492 361/679.4 |
| 2015/0179229 A1* | 6/2015 | Liang | H05K 7/14 248/544 |
| 2016/0217097 A1* | 7/2016 | Gomez | G06F 13/4068 |
| 2016/0293223 A1 | 10/2016 | Ehlen | |
| 2017/0018293 A1 | 1/2017 | Chen et al. | |
| 2017/0147042 A1 | 5/2017 | Liu et al. | |
| 2017/0185100 A1* | 6/2017 | Nguyen | G06F 1/10 |
| 2017/0300445 A1* | 10/2017 | McKnight | G06F 13/4027 |

* cited by examiner

DEVICE CARRIERS

The disclosure herein relates to device carriers, and further to systems and apparatus related to such device carriers.

SUMMARY

One exemplary carrier may include a first side rail and a second side rail spaced apart from the first side rail to receive a device therebetween. Each of the first and second side rails extend from a forward end region to an interface end region. The exemplary carrier may further include a first movable portion movably coupled to the first side rail and a second movable portion movably coupled to the second side rail. The first and second movable portions may be couplable to the device to allow the device to move towards or away from the interface end region.

One exemplary system may include a carrier to receive a device and extending from a forward end region to an interface region. The interface region may include one or more interface adapter supports to receive an interface adapter. The exemplary system may further include a plurality of different interface adapters to adapt a device interface of the device to an adapter interface different than the device interface. Each of the interface adapters may be positionable between the device and the interface region to allow operable coupling of the adapter interface to a corresponding interface of an enclosure that receives the carrier.

One exemplary apparatus may include a first side rail and a second side rail spaced apart from the first side rail to toollessly receive a device therebetween. The first and second side rails may extend from a forward end region to an interface end region, and the first and second side rails may allow the device to move between at least a device interface position and an adapter interface position. When in the device interface position, the device interface may be positioned proximate the interface region to allow operable coupling of the device interface to a corresponding interface of an enclosure that receives the carrier. When in the adapter interface position, the device interface may be positioned apart from the interface region to allow an interface adapter to be positioned between the device and the interface region.

The above summary is not intended to describe each embodiment or every implementation of the present disclosure. A more complete understanding will become apparent and appreciated by referring to the following detailed description and claims taken in conjunction with the accompanying drawings. In other words, these and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings.

DETAILED DESCRIPTION

Figure 1:
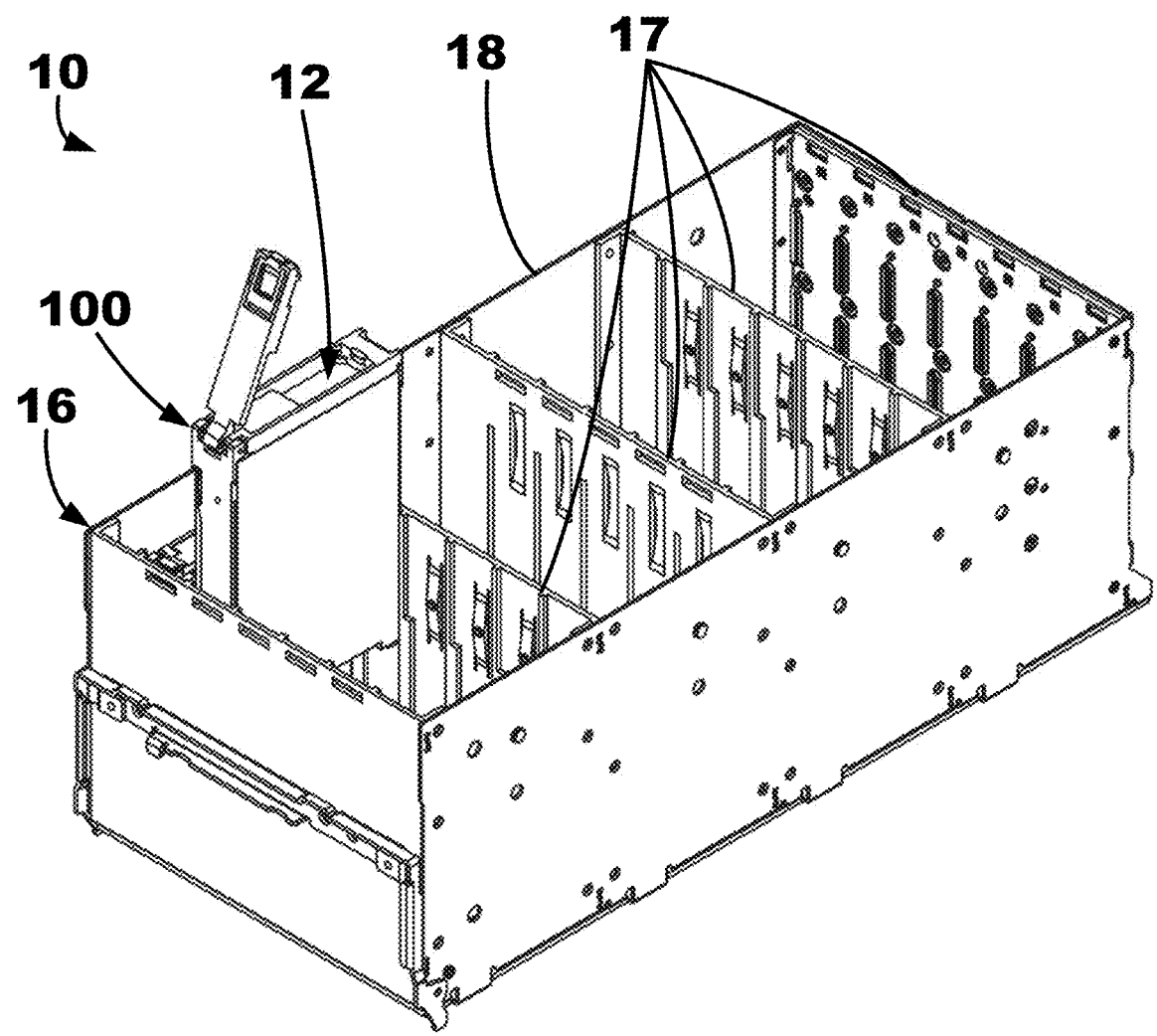
FIG. 1 is a perspective view of an enclosure system including a receiving frame and a device captured by an exemplary carrier.

Exemplary systems, carriers, and carrier apparatus shall be described with reference to FIGS. 1-5. It will be apparent to one skilled in the art that elements or processes from one embodiment may be used in combination with elements or processes of the other embodiments, and that the possible embodiments of such systems, carriers, and carrier apparatus using combinations of features set forth herein is not limited to the specific embodiments shown in the figures and/or described herein. Further, it will be recognized that the size and shape of various elements herein may be modified but still fall within the scope of the present disclosure, although certain one or more shapes and/or sizes, or types of elements, may be advantageous over others.

The present disclosure relates to adaptable carriers that receive devices. The carriers may be received by enclosures such that the devices contained within the carriers may interface with one or more circuit boards of the enclosure. The devices may include any device that may be received by and carried by the carriers. In one or more embodiments, the devices are data storage drives, which may include any device and/or apparatus configured to store data (e.g., binary data, etc.). The data storage drives may include one or more storage mediums that can include, but is not necessarily limited to, solid state memory, hard magnetic discs, magnetic tapes, optical discs, integrated circuits, volatile memory, nonvolatile memory, and any combination thereof. In one or more embodiments, the devices may be computing devices such as e.g., file or storage servers, network attached storage (NAS) servers, cold storage servers, workstations, etc.

The enclosures may be used to removably, physically and operably couple each of devices contained within the carriers to other computer apparatus such as, a storage area network or other computing system that provides an information technology service. In such cases, the carriers may be mounted within an enclosure, such as a rack enclosure, or otherwise mounted to a larger structure during use. Such an enclosure may include a circuit board, such as a midplane or baseplane, that electrically, optically, or otherwise operably connects to the devices, for example, to transfer information and power.

Devices can be defined by standards that specify or control the geometry of the device. For example, the small form factor (SFF) and large form factor (LFF) definitions control the mounting hole locations, connector location, and maximum dimensions for base casting. Except for this geometry, the other exterior features and dimensions of an SFF device or LFF device may be uniquely configured, such as the height of the device. A carrier can be used to capture the unique geometry of a device to facilitate mounting to a particular type of enclosure. When captured by a carrier, the device may then be securely mounted to the enclosure via the carrier and operably connected to the circuit board of the enclosure.

The devices may include an interface to be operably coupled, or connected, to the circuit board or another equivalent structure of the enclosure. Some devices may include a different interface than the enclosure, and thus may utilize an exemplary interface adapter to adapt the interface of the device to the interface of the enclosure. For example, the industry has many types of data storage devices, like single, dual PCIe/NVMe drive, SAS, & SATA. Interface adapters within the exemplary carriers can be used between the midplane and data storage devices for different types of applications.

Exemplary carriers described herein may be configurable to receive devices to position the interfaces of the devices to be operably coupled, or connected, to the corresponding interface of the enclosure when the carriers are received thereby, and further may be configurable to receive devices and interface adapters to adapt the interfaces of the devices to the interfaces of the enclosures. In this way, a single type of carrier can be used for devices that require or do not require interface adapters to be used with an enclosure.

Further, the exemplary carriers and portions thereof may be used to capture devices without the use of additional tools (such as, e.g., screws, screwdrivers, and the equivalents thereof). For example, exemplary toolless carrier structures and apparatus that may be used with the exemplary carriers described herein may be described in U.S. patent application Ser. No. 15/356,920 filed on Nov. 21, 2016, and entitled "STORAGE DEVICE CARRIER AND RELATED SYSTEMS AND METHODS," which is incorporated herein by reference in its entirety.

The exemplary toolless carrier may be described as being able to support a device (e.g., hard disk drive) with an interface adapter or a device without an interface adapter. In an adapter interface position or configuration, the interface adapter may be operably coupled to an interface of the device and may provide another interface that may be positioned proximate an interface region of the carrier such that the interface adapter may be coupled to a network or data interface topology of a system (e.g., enclosure). In this way, the interface adapter may adapt, or change, the interface of the device to another interface. In a device interface position or configuration, the interface of the device may be proximate an interface region of the carrier such that the device may be coupled to a network or data interface topology of a system (e.g., enclosure).

The exemplary carriers and systems may be described as providing ease of service because, e.g., a user may only need to bring a replacement drive and can re-use an existing carrier without the use of tools. Further, the exemplary carriers may be used with optional interface adapters, or interposer cards, such that a user may use the same carrier for many applications having different interfaces. The interface adapter, or interposer, can be used for many applications. For example, the interface adapter, or interposer, may enable single ported serial ATA (SATA) drives to connect to like native dual-ported drives for use in enterprise storage systems using serial attached SCSI (SAS) expanders. Further, for example, the interface adapter, or interposer, may enable a single port drive to be used in system which is designed for dual-port drives. Still further, for example, the interface adapter, or interposer, may act as a connecting device to avoid damage to a drive connector where device removal is frequent.

The following terms used throughout the present disclosure are defined as follows, unless the context of the disclosure dictates otherwise:

As used herein, "capture" means to attach to a device for purposes of mechanical mounting to another structure. For example, a device may be captured by attaching a carrier to it. The carrier may be used to mount the device to an enclosure.

As used herein, "mount" means to attach to a structure for operational use. For example, a device may be mounted to an enclosure by attaching the device to a receiving frame of the enclosure and optionally connecting the device to a circuit board of the enclosure such that the device is installed in the enclosure.

As used herein, "secure" means to restrict the movement of a component relative to another component suitably for a particular application. For example, a carrier may secure the device by disposing the device between two side rails, a forward portion, and a rear portion of the carrier to restrict movement of the device relative to the carrier for purposes of mechanical mounting to an enclosure.

As used herein, "engage" means to interface, touch, or directly contact to accomplish a particular task. For example, a restriction tab may engage a deflectable tab of a movable portion to restrict movement of the movable portion.

The terms "coupled" or "connected" refer to elements being attached to each other either directly (in direct contact with each other) or indirectly (having one or more elements between and attaching the two elements).

Terms related to orientation, such as "top," "bottom," "side," and "end," are used to describe relative positions of components and are not meant to limit the orientation of the embodiments contemplated. For example, an embodiment described as having a "top" and "bottom" also encompasses embodiments thereof rotated in various directions unless the content clearly dictates otherwise.

Reference will now be made to the drawings, which depict one or more aspects described in this disclosure. However, it will be understood that other aspects not depicted in the drawings fall within the scope and spirit of this disclosure. Like numbers used in the figures refer to like components, elements, portions, regions, openings, apertures, and the like. However, it will be understood that the use of a reference character to refer to an element in a given figure is not intended to limit the element in another figure labeled with the same reference character.

FIG. 1 shows an enclosure system 10 according to one or more embodiments. As illustrated, the enclosure system 10 includes a device 12 (e.g., a data storage device, a computing device, etc.) captured in a carrier 100 in the process of being mounted into or unmounted from an enclosure 16. The enclosure 16 may include a receiving frame 18 and a circuit board or similar circuitry located at the bottom or back of the receiving frame 18 as depicted in FIG. 1. Although not shown, the enclosure 16 may include a shroud to cover the receiving frame 18 and any mounted carriers 100.

The enclosure 16 may be configured to receive one or more carriers 100 carrying, or holding, devices 12. In some embodiments, the enclosure 16 defines one or more arrays of carriers 100 (e.g., multiple rows). Although as illustrated, only one carrier 100 is shown for illustrative purposes, the carriers 100 may be arranged in any suitable manner. In some embodiments, the carriers 100 are in a "tombstone" arrangement, in which the carriers 100 are inserted length-wise into the receiving frame 18 of the enclosure 16. The carriers 100 may be stacked height-wise into rows. Each row of carriers 100 may be as wide as the carriers 100 therein. The rows of carriers 100 may be stacked.

Each carrier 100 may be mounted adjacent to one or more sidewalls 17 of the receiving frame 18. The sidewalls 17 may be engaged by the carriers 100 to secure the captured devices 12 to the enclosure 16. One or more sidewalls 17 may also separate the rows of carriers 100 within the enclosure 16.

A user may position or at least partially dispose the carriers 100 within the receiving frame 18 until the carriers 100 are mounted to the enclosure 16. In one or more embodiments, it may be described that the carriers 100 are configured to allow the user to control the mounting process by handling the carriers 100 as opposed to the devices 12 contained therein.

After being positioned in the enclosure 16, a user may secure the carriers 100 to the receiving frame 18 to complete the mounting process. In one or more embodiments, the carriers 100 are configured to allow the user to lock the carriers 100 to the receiving frame 18. Securing the carriers 100 to the receiving frame 18 may also to establish a connection or operable coupling from the devices 12 to a circuit board of the enclosure 16. In one or more embodiments, the devices 12 are operably connected to a circuit board such as e.g., a midplane, when mounted, for example, to transfer data or power. Such a connection may be electrical, optical, electromagnetic, or any other suitable type of connection.

More specifically, each of the devices 12 may include a device interface that is configured to be operably coupled to an interface of the enclosure. The carriers 100 may be configured to house the devices 12, and when coupled to the enclosure 16, facilitate the operable functional coupling of the device interface of the devices 100 to the interfaces of the enclosure 16. As will be described further herein, the device interface of at least one device 12 may be different than at least one interface of the enclosure 16, and thus, an interface adapter may be used to adapt the device interface to the interface of the enclosure 16. Further, in other words, the exemplary carriers 100 described herein may be configured to position the device interface of devices contained therein so as to be operably coupled to the interfaces of the enclosure 16 when the carriers 100 are received by enclosure 16. Still further, the exemplary carriers 100 may be further configured to position the devices 12 and their corresponding device interfaces such that interface adapters may be positioned inside, or in a space, of the carriers 100 between the device interface and the interface of an enclosure 16 when the carriers 100 are received by enclosure 16.

An exemplary carrier 100 configured to capture a device 12 such as, e.g., computing devices, data storage devices, etc. is depicted in more detail in FIGS. 2-5. When securely captured, the device 12 may be at least partially disposed within the carrier 100. In some embodiments, the carrier 100 may engage two sides of the device 12. In one or more embodiments, the carrier 100 may engage more than two sides of the device 12.

As shown, the carrier 100 may extend from a forward region end region 102 to an interface end region 104 along a carrier axis 101. The forward end region 102 may be positioned, or located, on a front side of an enclosure 16 when the carrier 100 is positioned therein. The interface end region 104, which may be described as being opposite the forward end region 102, may be inserted in the enclosure 16 when the carrier 100 being positioned therein.

The carrier 100 may include a first side rail 110 and a second side rail 112 spaced apart from the first side rail 110 such that a device 12 may be positioned therebetween and securely coupled to the carrier 100. As will be further described herein, the carrier 100 may be configured to toollessly couple the device 12 therein. The first and second side rails 110, 112 may each be described as extending from the forward end region 102 to the interface end region 104 in a direction parallel to the carrier axis 101. The carrier 100 may further include a forward portion, or face plate, 106 coupled to each of the first and second side rails 110, 112 at, or proximate, the forward end region 102 and a rear portion 108 coupled to each of the first and second side rails 110, 112 at, or proximate, the interface end region 104.

Figure 5A:
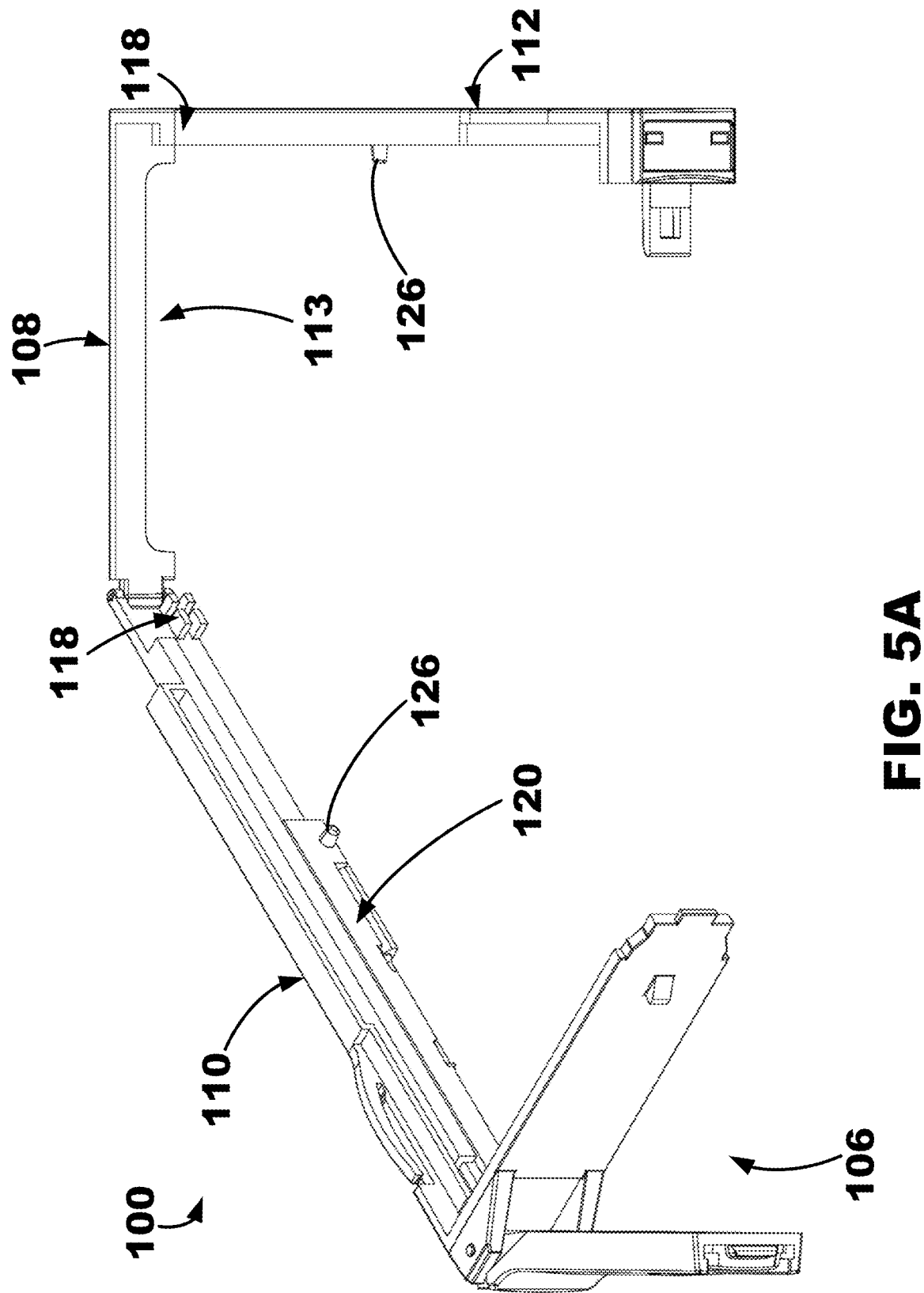
FIG. 5A depicts a top perspective view of the carrier of FIGS. 2-4 when configured in the device interface position and in an open configuration to receive a device.
Figure 5B:
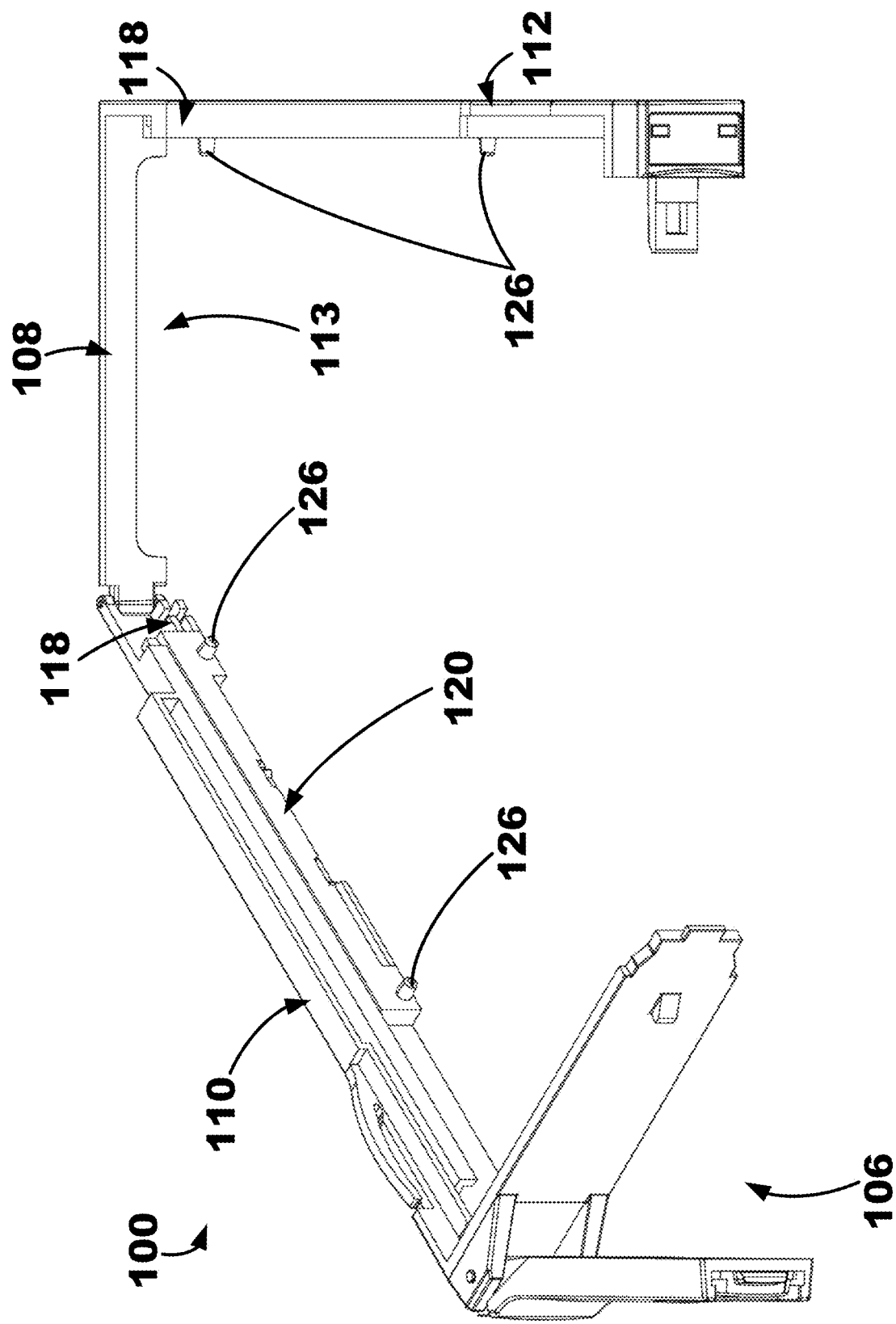
FIG. 5B depicts a top perspective view of the carrier of FIGS. 2-4 when configured in the adapter interface position and in an open configuration to receive a device and an interface adapter.

Each of the first and second side rails 110, 112, the forward portion 106, and the rear portion 108 may be removably coupled to each so as to be able to be wrapped around the device 12 to secure the device 12 therein as shown in and further described herein with respect to FIGS. 5A-5B. It may be described that each of the first and second side rails 110, 112, the forward portion 106, and the rear portion 108 may define a carrier frame 109 that defines an interior space 111, within which the device 12 may be positioned.

Figure 2A:
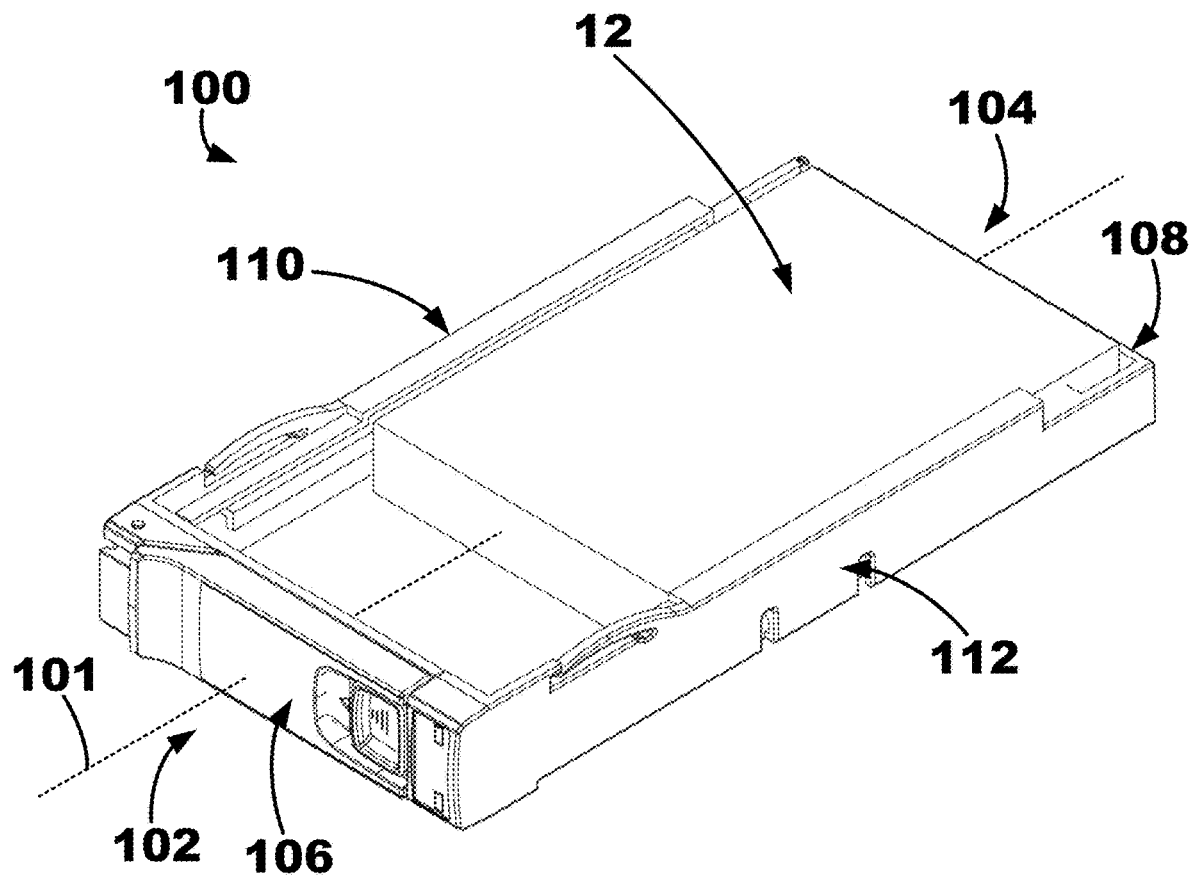
FIG. 2A is a top perspective of an exemplary carrier configured in a device interface position and a device received thereby.
Figure 2B:
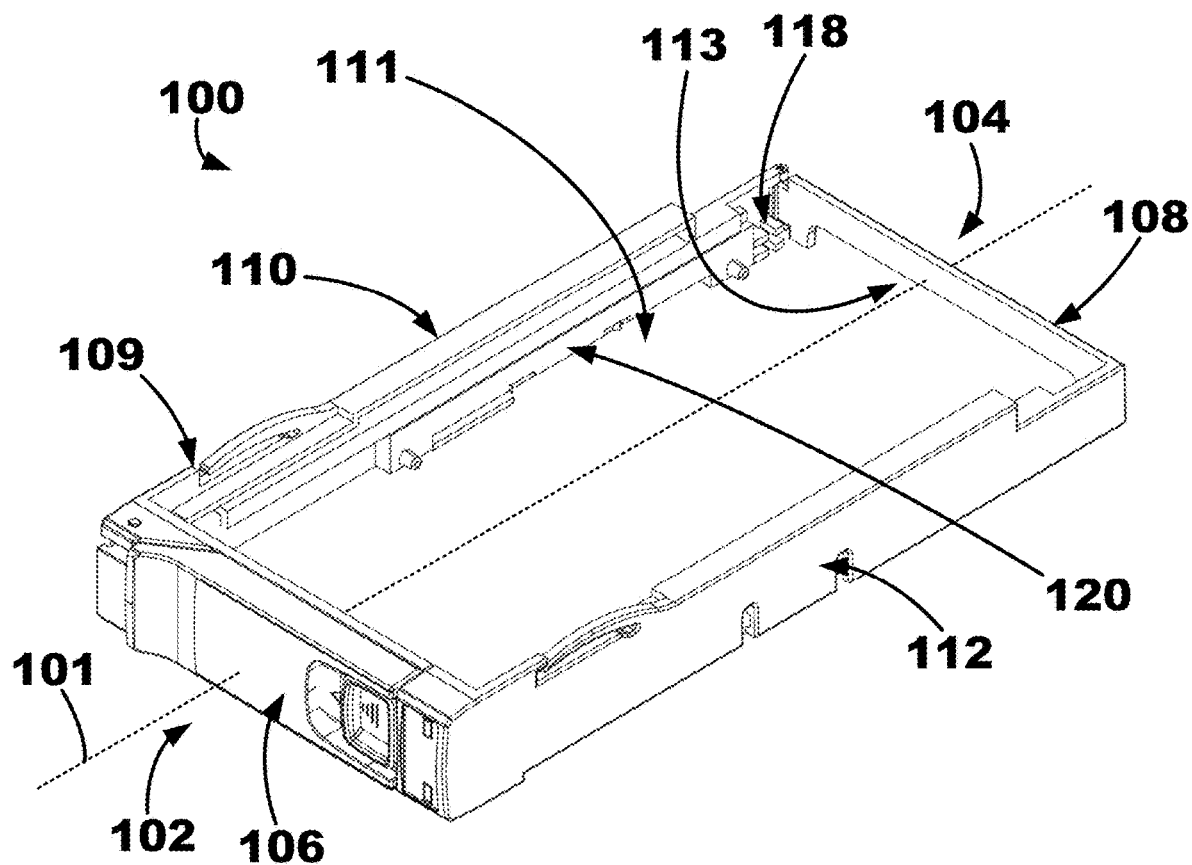
FIG. 2B is a top perspective of the carrier of FIG. 2A configured in the device interface position without the device received thereby.
Figure 2C:
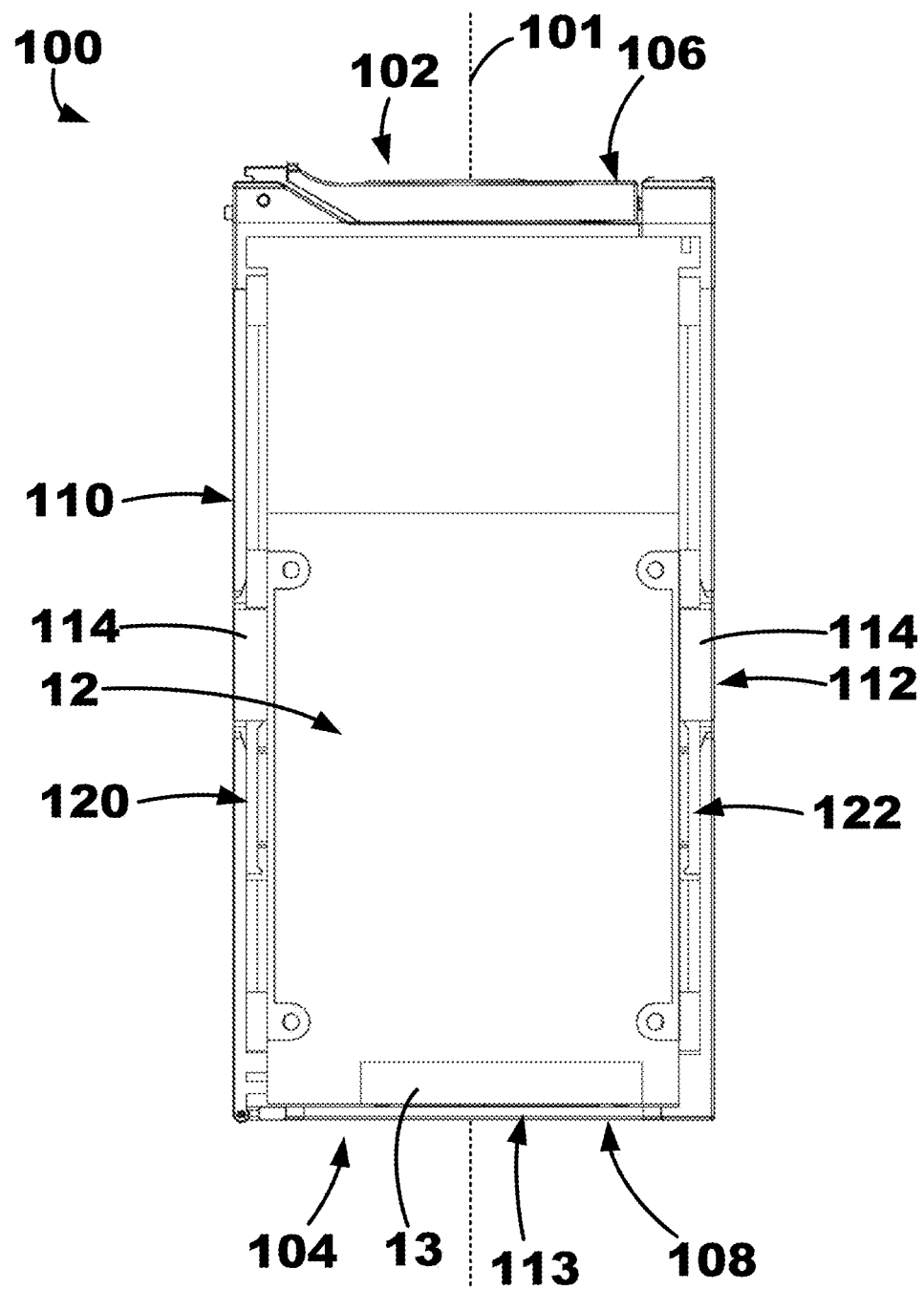
FIG. 2C is a bottom view of the carrier of FIG. 2A configured in a device interface position and the device received thereby.
Figure 2D:
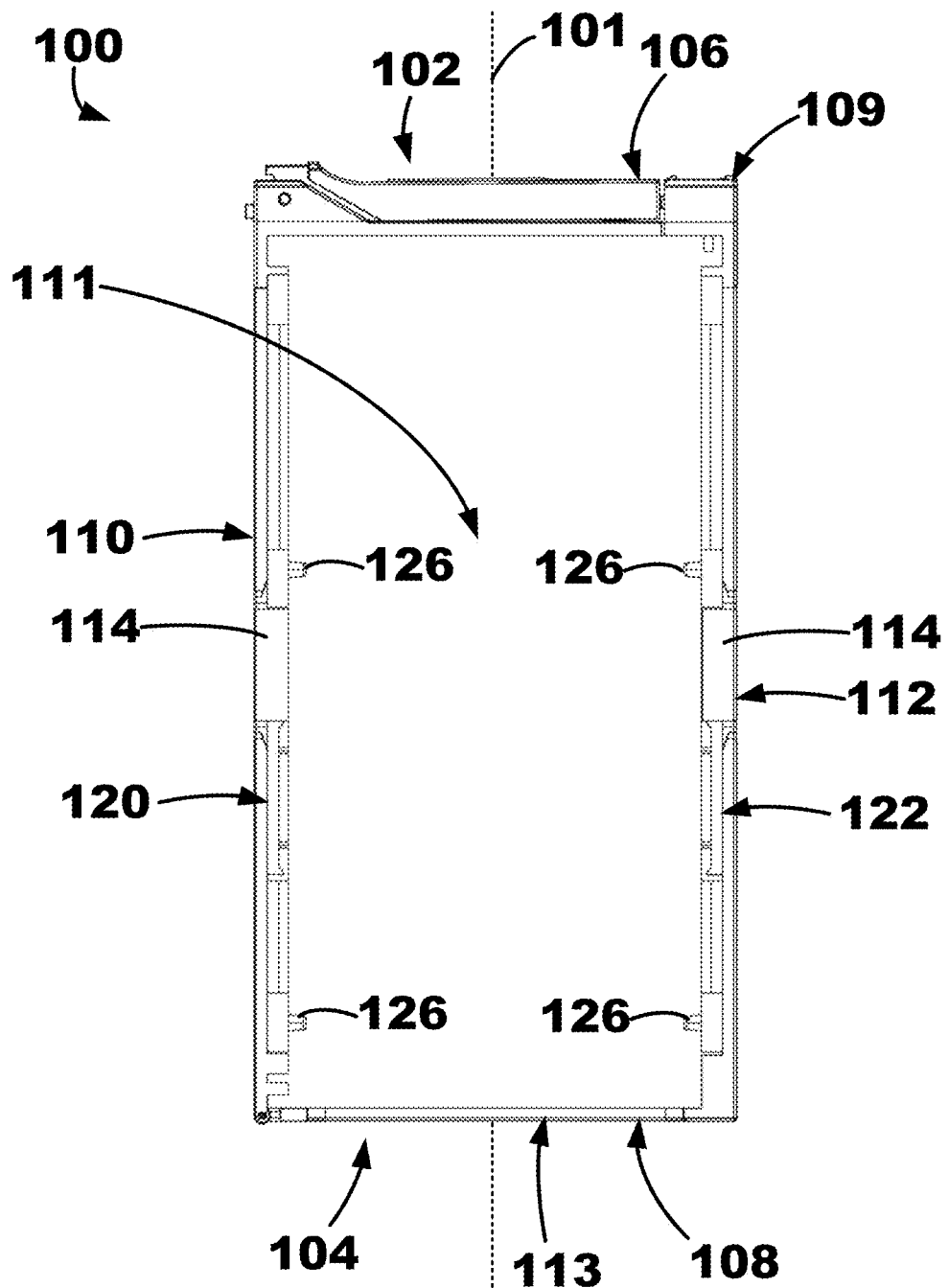
FIG. 2D is a bottom view of the carrier of FIG. 2A configured in the device interface position without the device received thereby.
Figure 2E:
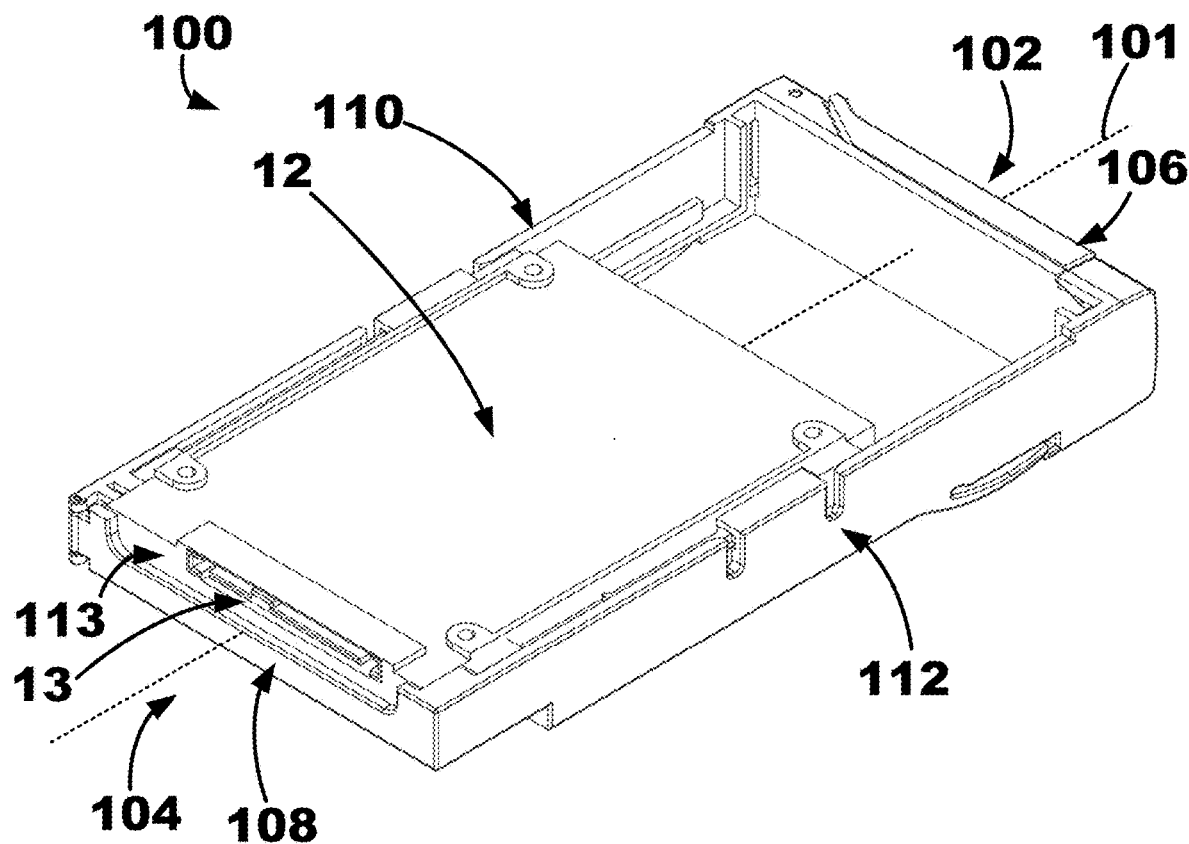
FIG. 2E is a bottom perspective view of the carrier of FIG. 2A configured in a device interface position and the device received thereby.
Figure 2F:
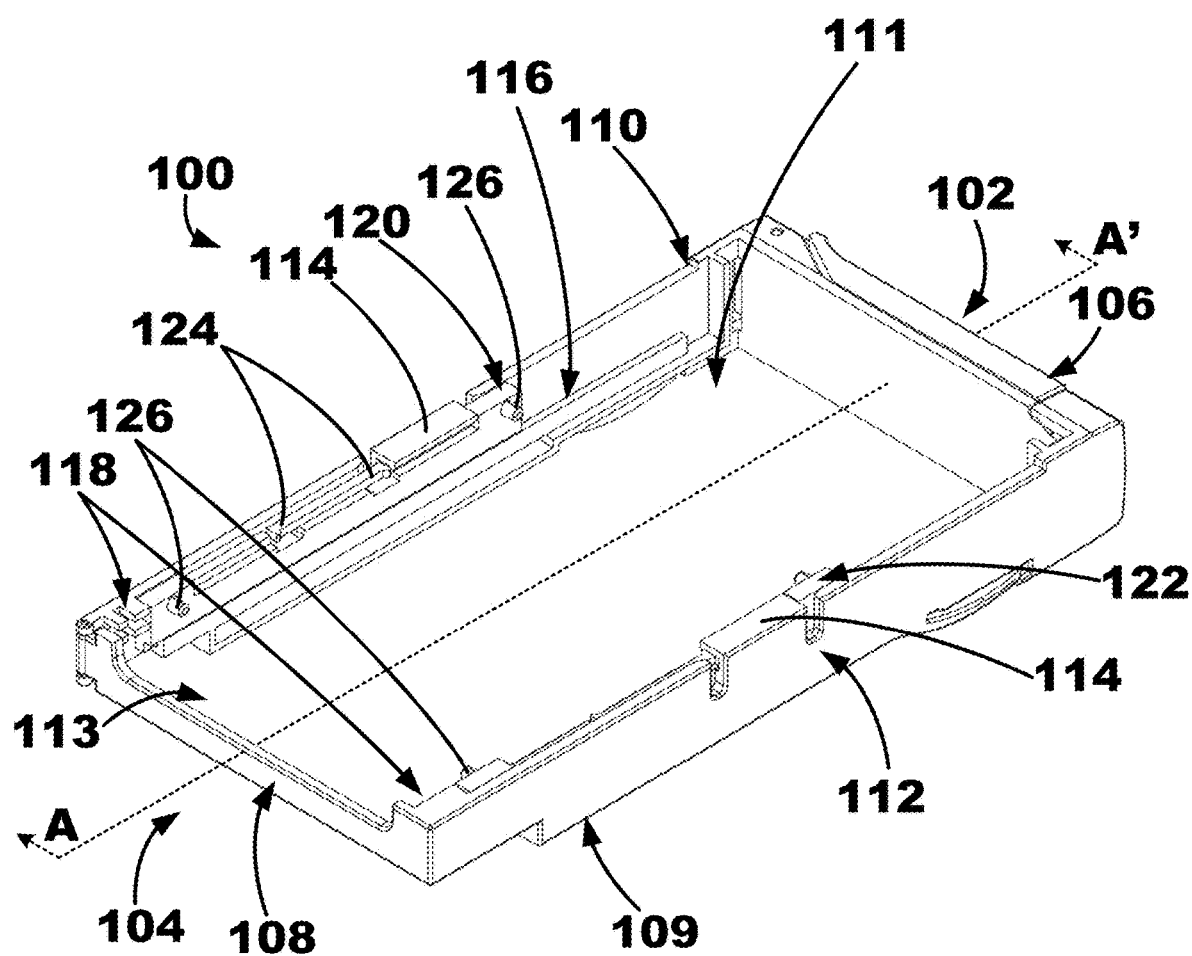
FIG. 2F is a bottom perspective view of the carrier of FIG. 2A configured in the device interface position without the device received thereby.
Figure 3A:
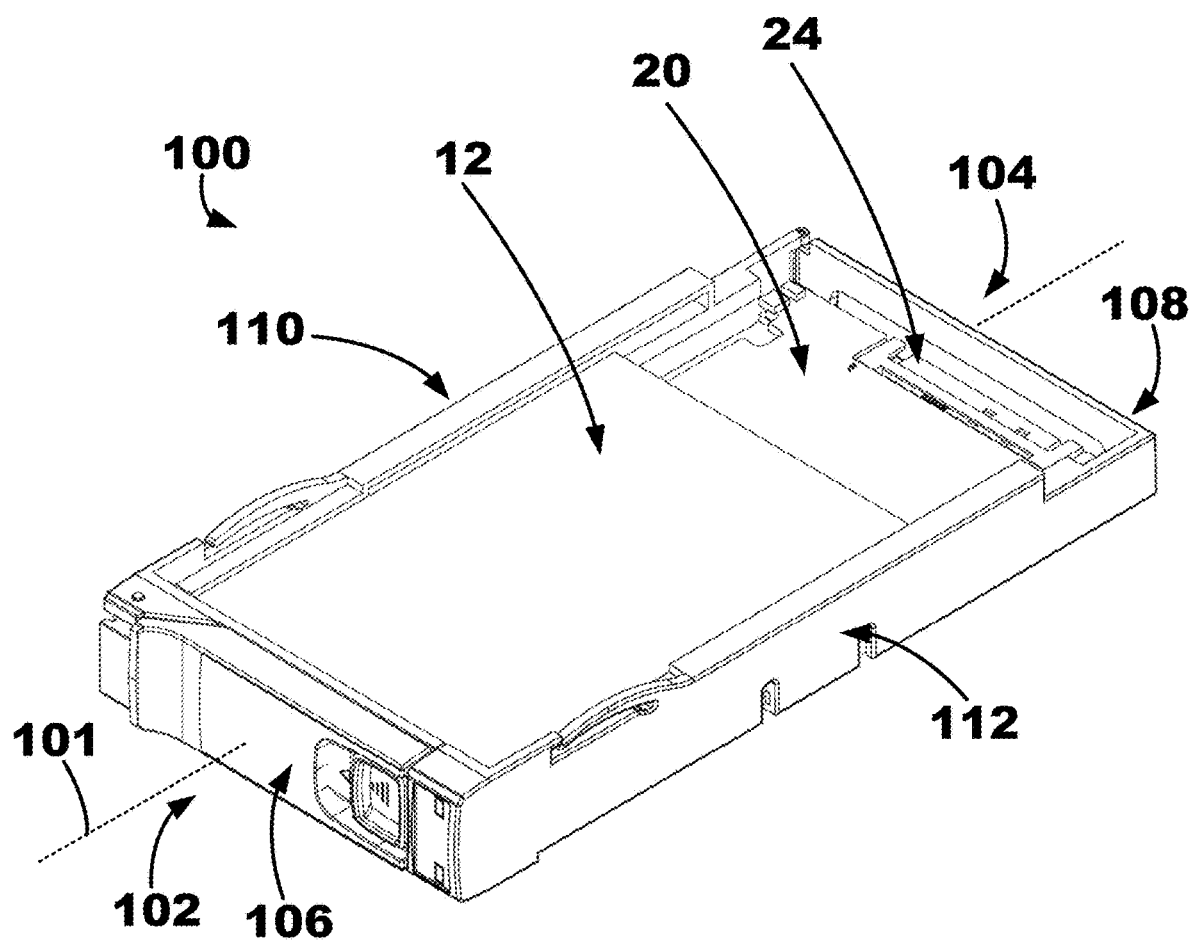
FIG. 3A is a top perspective of an exemplary carrier configured in an adapter interface position and a device and an interface adapter received thereby.
Figure 3B:
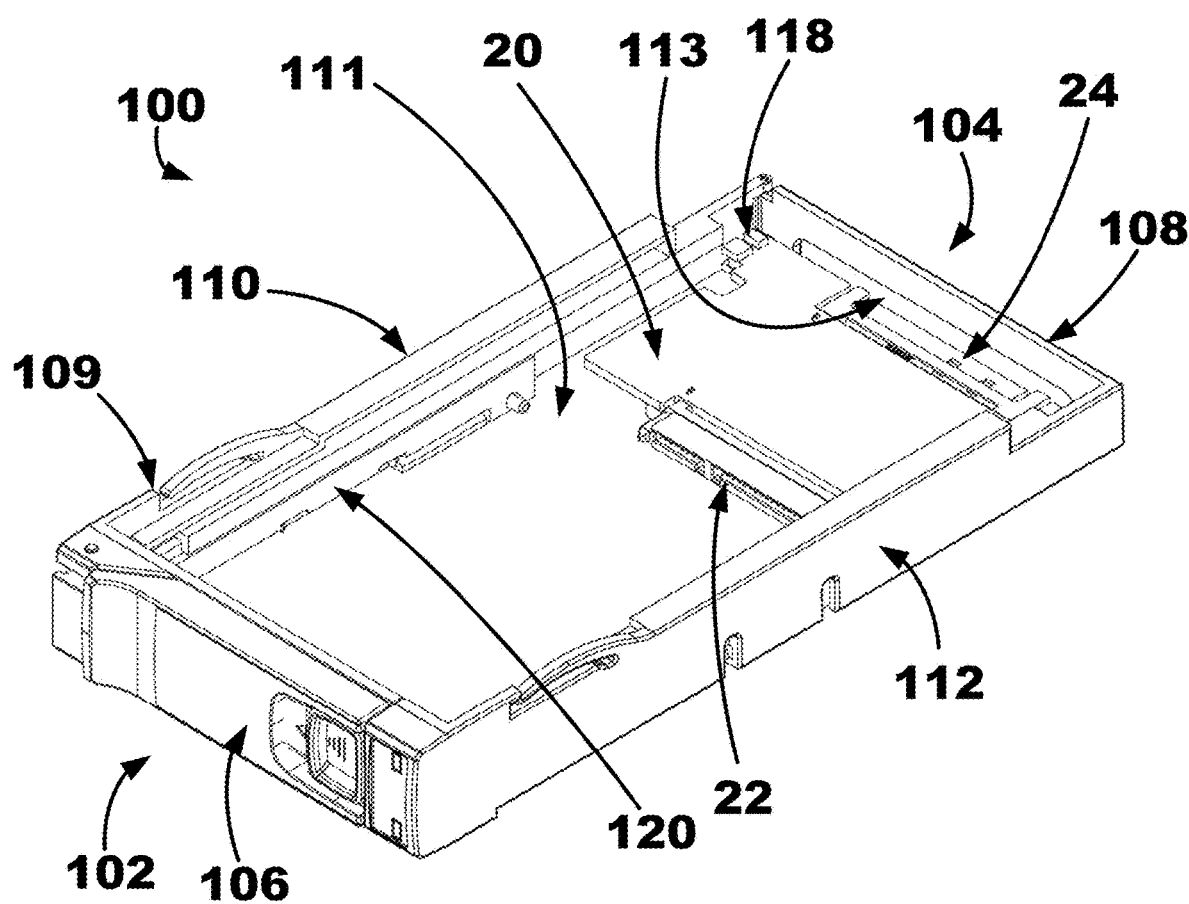
FIG. 3B is a top perspective of the carrier of FIG. 3A configured in the adapter interface position without the device received thereby.
Figure 3C:
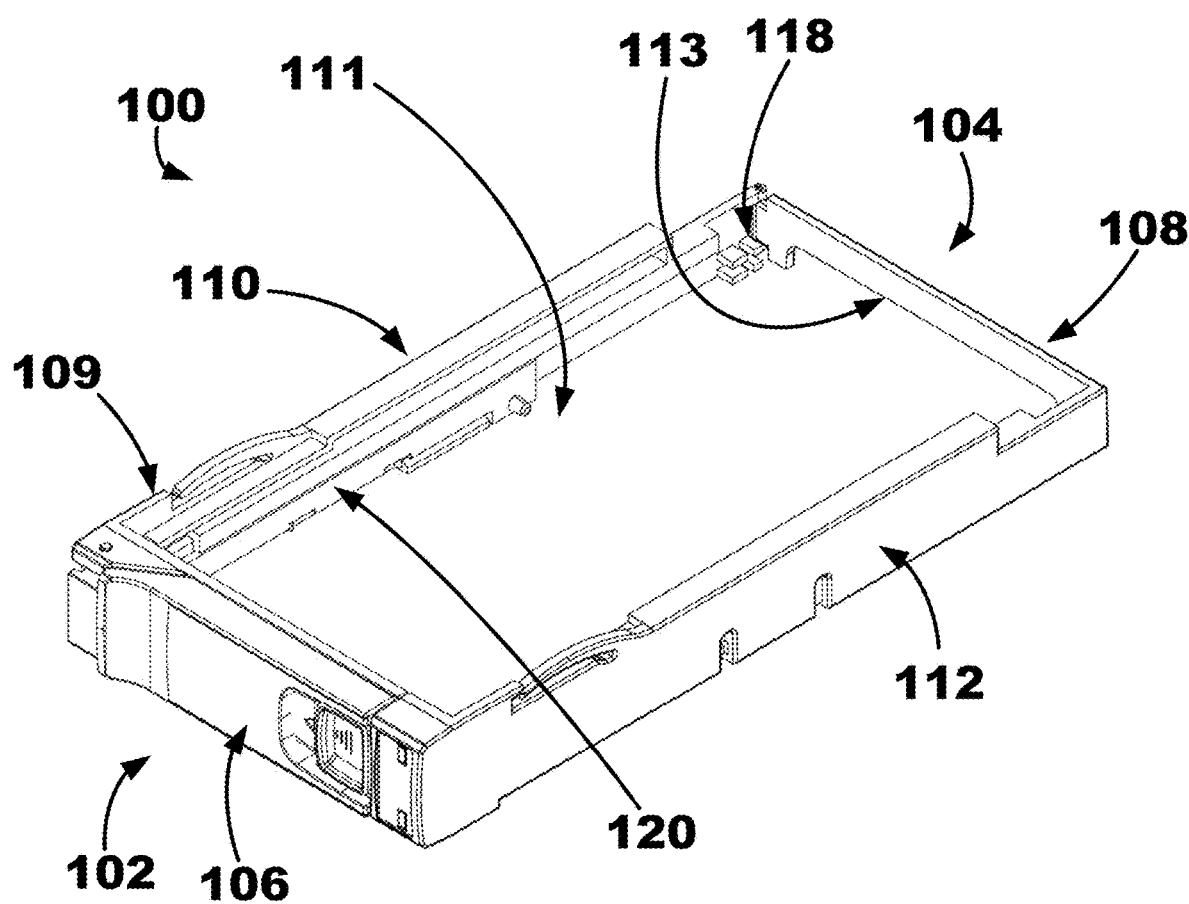
FIG. 3C is a top perspective of the carrier of FIG. 3A configured in the adapter interface position without the device and the interface adapter received thereby.
Figure 3D:
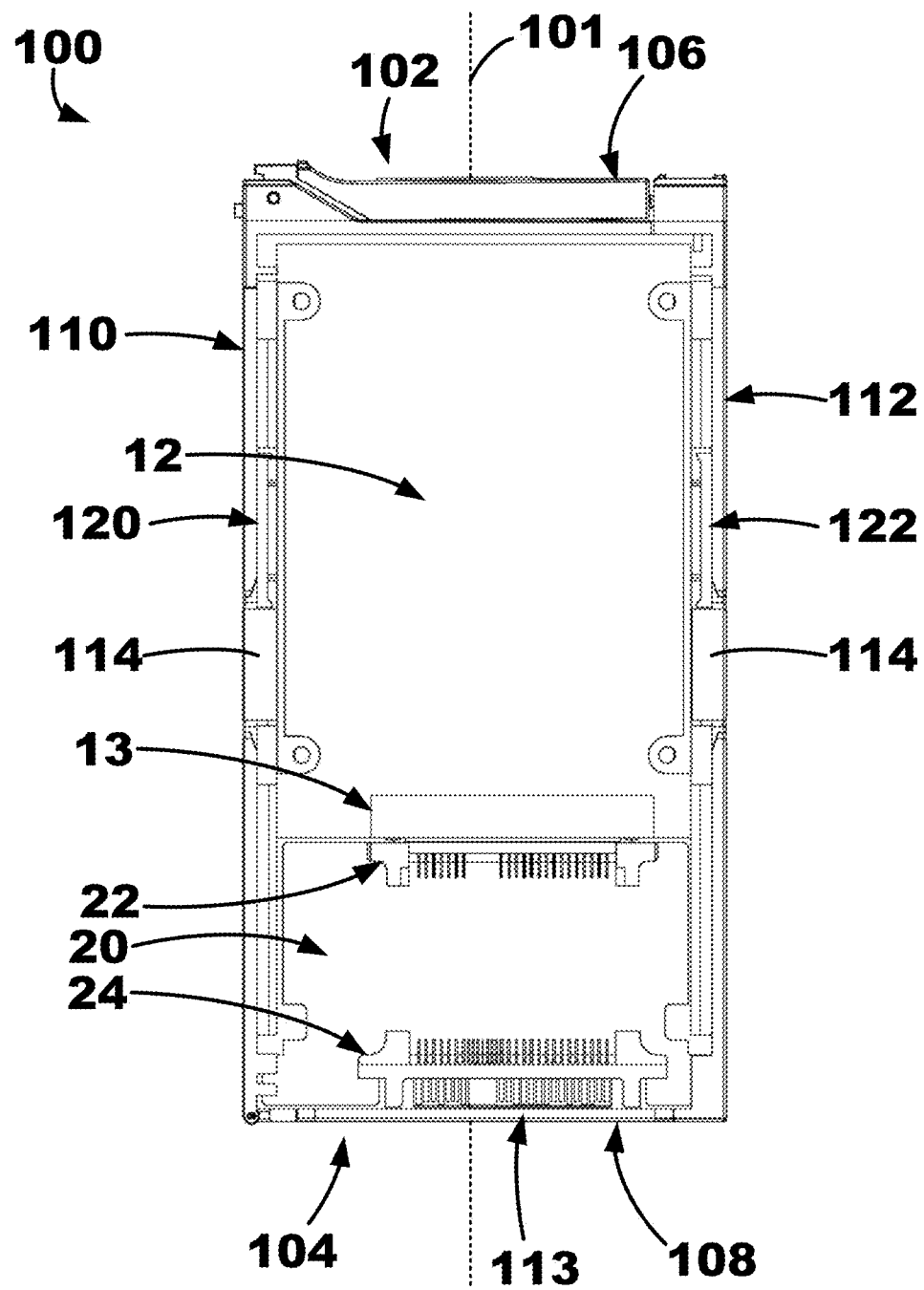
FIG. 3D is a bottom view of the carrier of FIG. 3A configured in the adapter interface position and a device and an interface adapter received thereby.
Figure 3E:
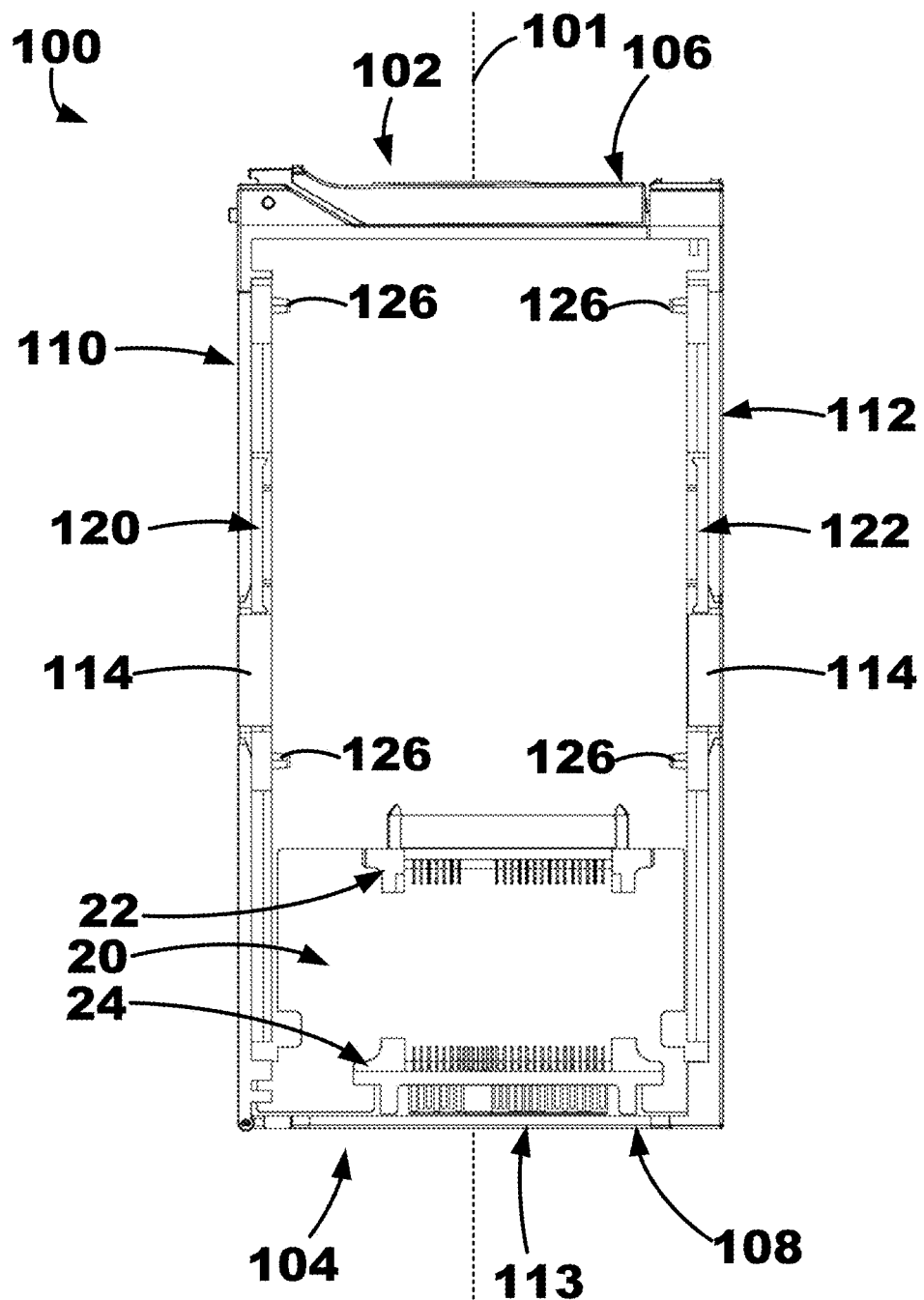
FIG. 3E is a bottom view of the carrier of FIG. 3A configured in the adapter interface position without the device received thereby.
Figure 3F:
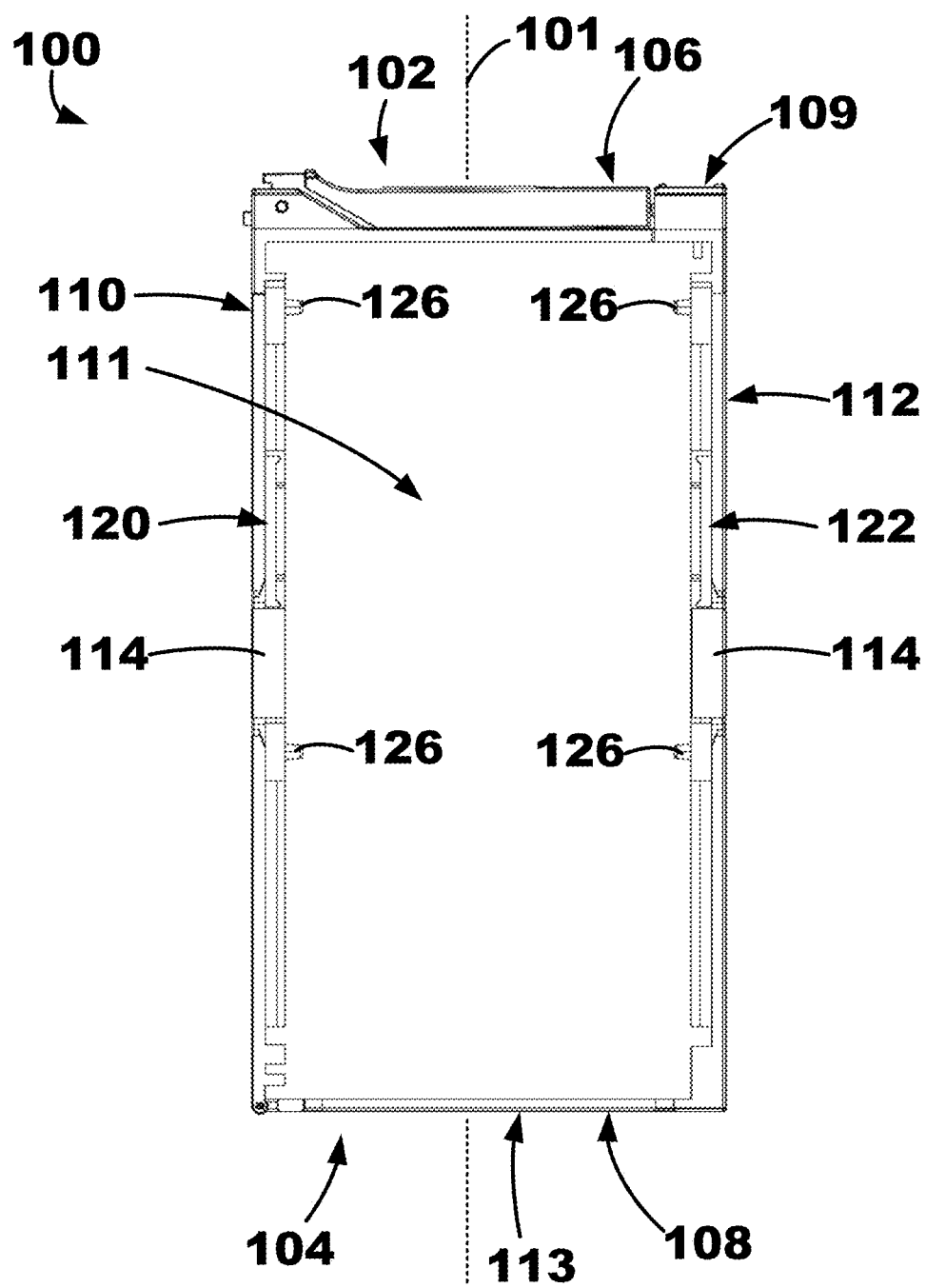
FIG. 3F is a bottom view of the carrier of FIG. 3A configured in the adapter interface position without the device and the interface adapter received thereby.
Figure 3G:
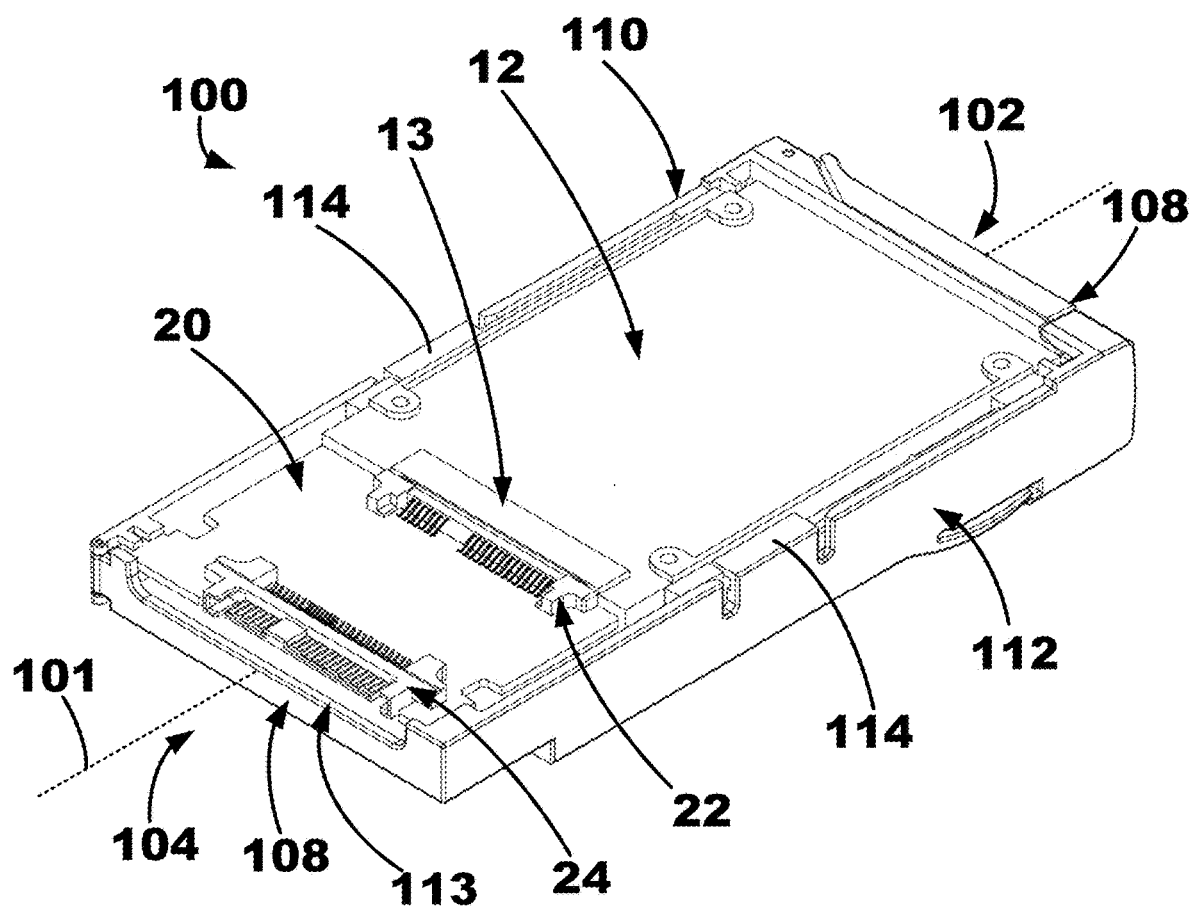
FIG. 3G is a bottom perspective view of the carrier of FIG. 3A configured in the adapter interface position and a device and an interface adapter received thereby.
Figure 3H:
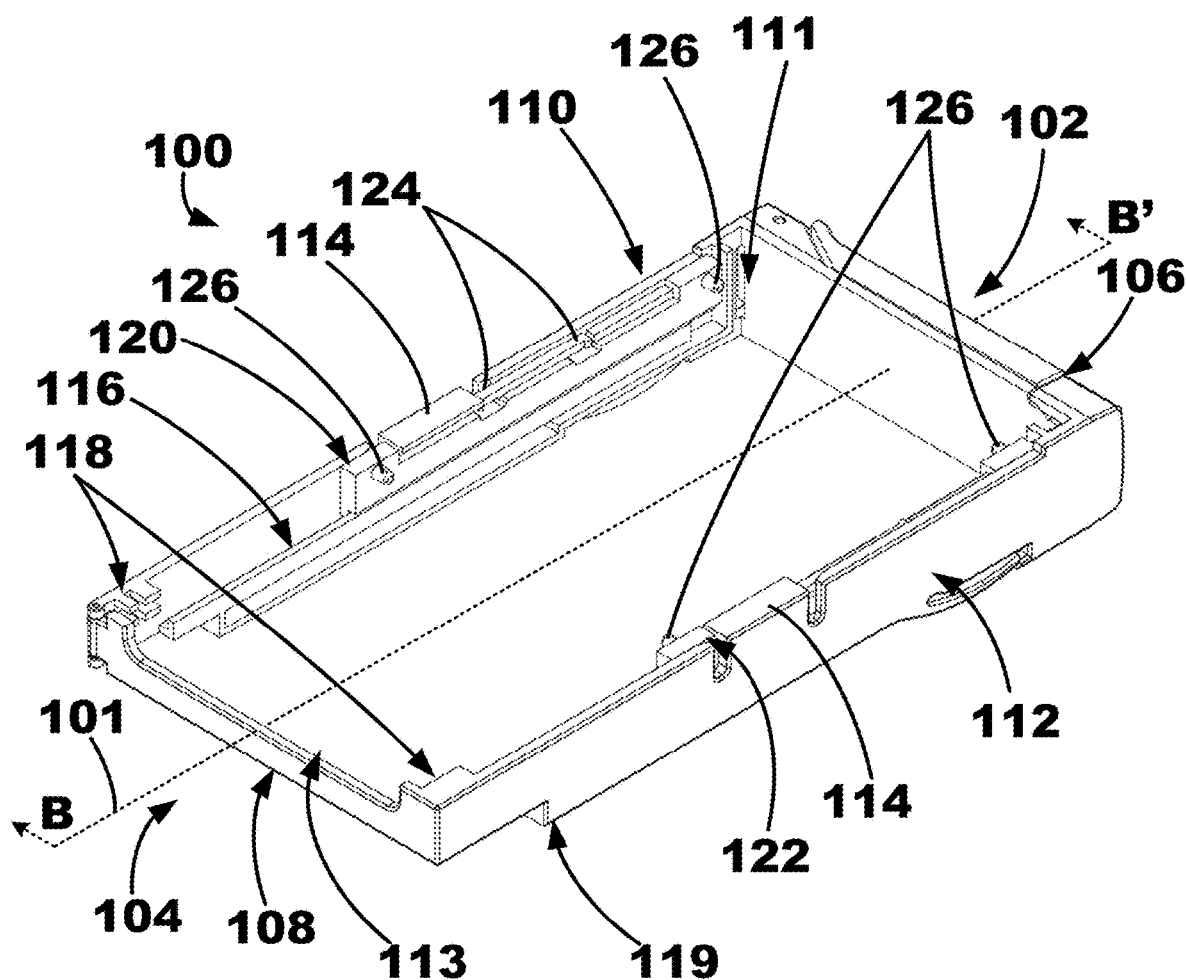
FIG. 3H is a bottom perspective view of the carrier of FIG. 3A configured in the adapter interface position without the device and the interface adapter received thereby.
Figure 3I:
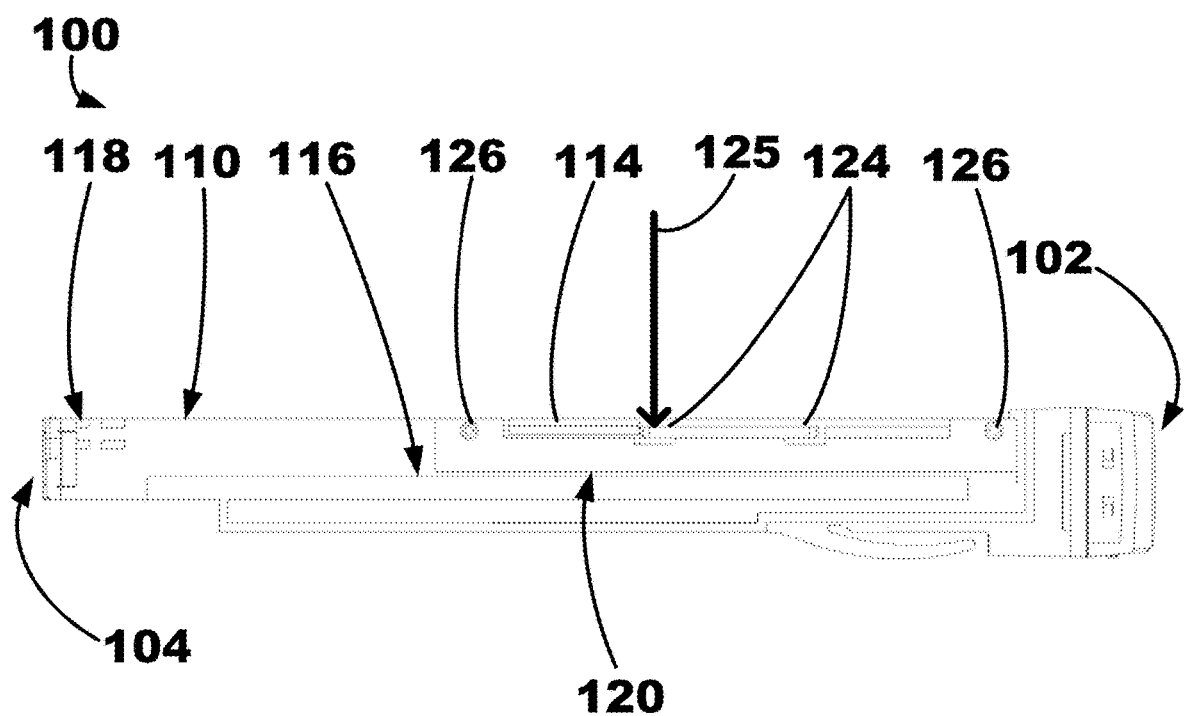
FIG. 3I is a side cross-sectional view of the carrier taken across line B-B' of FIG. 3H.
Figure 4:
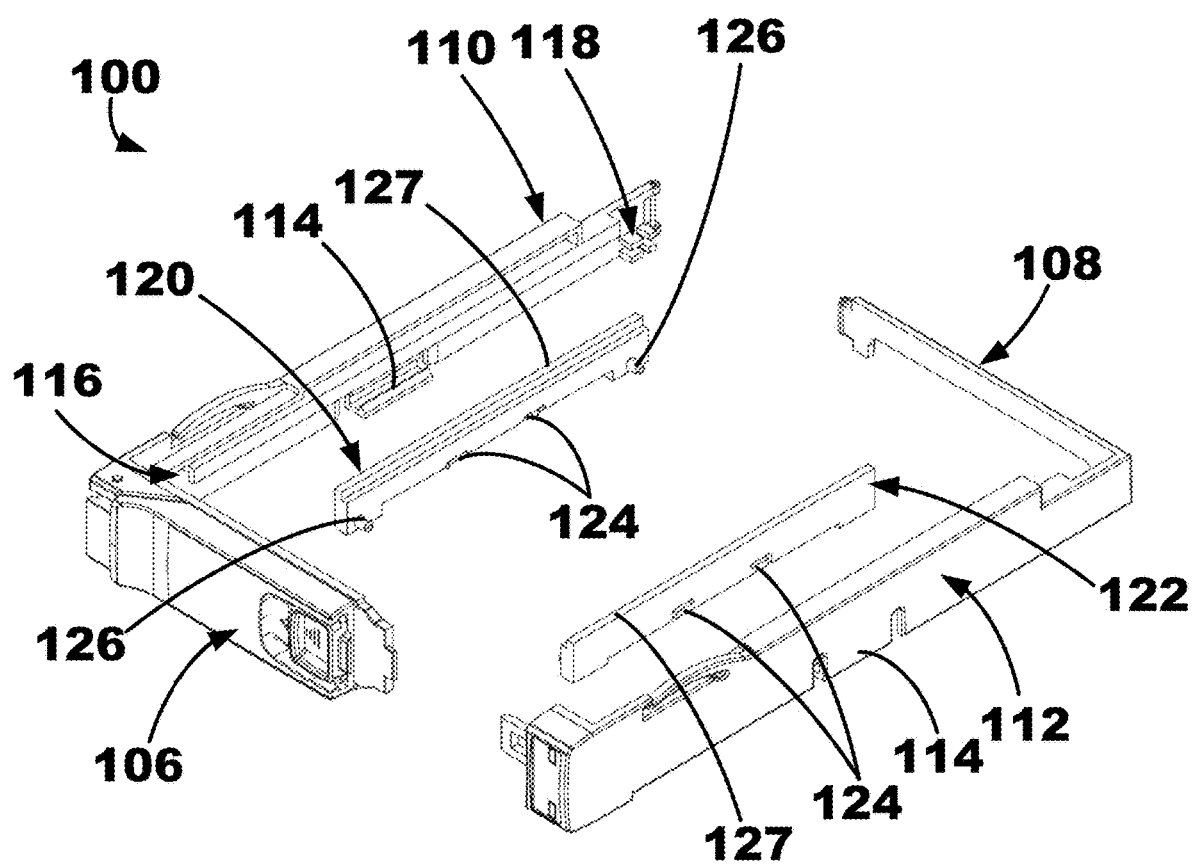
FIG. 4 is a top perspective, exploded view of the carrier of FIGS. 2-3.

As shown best in FIGS. 2E and 3G, the rear portion 108 may further define an interface opening 113 that is configured for the coupling an interface of the enclosure 16 to an interface of a device 12 or an interface of an interface adapter. For example, one or both of the interfaces presented by the carrier 100 (e.g., the device interface or the interface of an interface adapter) and the enclosure 16 may extend at least partially into the interface opening 113 to facilitate the operable coupling therebetween.

The exemplary carrier 100 may be described as being adaptable or configurable in various ways to provide the functionality described herein. For example, the carrier 100 may be adapted, or configured, in at least a device interface position and an adapter interface position. The carrier 100 is adapted, or configured, in the device interface position as shown in FIGS. 2A-2F where a device interface 13 of the device 12 is positioned proximate the interface end region 108 to allow operable coupling of the device interface 13 to a corresponding interface of an enclosure 16 that receives the carrier 100.

The carrier 100 is adapted, or configured, in the adapter interface position in FIGS. 3A-3H where the device interface 13 of the device 12 is positioned apart, or away from, from the interface end region 108 to allow an interface adapter 20 to be positioned between the device 12 (and more specifically, the device interface 13 of the device 12) and the interface end region 108. In this way, an interface adapter 20 may be operably coupled to the device interface 13 of the device 12 to adapter, or convert, the device interface 13 to another interface that may be operably coupled to a corresponding interface of the enclosure 16. More specifically, the interface adapter 20 may include a device-side interface 22 that is configured for coupling to the device interface 13 and may include an enclosure-side interface 24 that is configured for coupling to an interface of the enclosure 16.

The interface adapter 20 may be configured to convert one interface to another interface. For instance, the interface adapter 20 may utilize one or more of the following electrical and/or optical interfaces such as, e.g., dual port interfaces, single port interfaces, peripheral control interface (PCI), PCI express (PCIe) interfaces, ATA interfaces, parallel ATA interfaces, serial ATA (SATA) interfaces, small computer system interface (SCSI) interfaces, serially attached SCSI (SAS) interfaces, non-volatile memory express (NVMe) interfaces, non-volatile memory host controller interface specification (NVMHCIS) interfaces, fibre channel interfaces, etc. For example, the interface adapter 20 may convert a SATA interface to a serially attached SCSI (SAS) interface. Further, for example, the interface adapter 20 may convert a single-ported SATA drive interface to a dual-ported SAS interface. Further, for example, the interface adapter 20 may convert a single-ported NVMe drive interface to a dual-ported NVMe interface.

In other words, the exemplary systems described herein may include a carrier, such as carrier 100, and a plurality of different interface adapters, such as interface adapter 20, to adapt a device interface of a device 12 to another interface different than the device interface. Each of the interface adapters may provide different interface conversion or adaptation but may still be used with the same carrier. In this way, a single carrier may be used with a plurality of different devices having a plurality of different interfaces and a plurality of different enclosures having a plurality of different interfaces. It may be described that the exemplary system including a carrier and plurality of different interface adapters may be a "kit" to adapt a plurality of different devices having different interfaces to work with, or interface with, a plurality of different enclosures having different interfaces.

In other words, the carrier 100 may be described as being adaptable, or configurable, to move a device 12 between a rearward position as shown in FIGS. 2A-G and a forward position as shown in FIGS. 3A-I. The rearward position may position the device interface 13 of the device 12 proximate the interface end region 108, and more specifically, within or proximate the interface opening 113 so as to be operably couplable to a corresponding interface of an enclosure 16. As described herein, the carrier 100 being configured in the device interface position may provide this rearward position.

The forward position may provide space between the device 12 and the interface end region 108 for an interface adapter 20 such that the device-side interface 22 of the interface adapter 20 may be operably coupled to the device interface 13 of the device 12 and the enclosure-side interface 24 of the interface adapter 20 is proximate the interface end region 108, and more specifically, within or proximate the interface opening 113 so as to be operably couplable to a corresponding interface of an enclosure 16.

The carrier 100 may include one or more (e.g., a plurality of) interface adapter supports 118 to receive the interface adapter 20. In this example, the interface end region 104 of each of the side rails 110, 112 includes the interface adapter supports 118. More specifically, the interface adapter supports 118 of each of the side rails 110, 112 includes four tabs extending from the side rails 110, 112 towards the interior space 111 of the carrier 100. Such tabs define a horizontal slot, extending parallel to the carrier axis 101, within which a portion (e.g., a side edge portion of a printed circuit board (PCB)) of the interface adapter 20 may be positioned so as to secure the interface adapter 20 within the carrier 100. Further, although the interface adapter supports 118 of the first side rail 110 are better viewable in the provided figures than the interface adapter supports 118 of the second side rail 112, it is to be understood that the seconds side rail 112 may include the same, similar, or different interface adapter supports 118 than the first side rail 110 so as to provide the same interface adapter securing functionality but for the opposite side of the interface adapter 20.

To provide the device interface position where the device 12 is positioned in the rearward position and the adapter interface position where the device 12 is positioned in the forward position, the carrier 100 may further include one or more movable portions that are movably coupled to the side rails 110, 112 or another portion of the carrier 100, and are toollessly couplable to the device 12. In this way, the device 12 may move along with the movable portions in respect to the remainder of the carrier 100 so as to provide both positions, or configurations, of the carrier 100 and positions of the device 12.

In the embodiment depicted in FIGS. 2-5, the carrier 100 includes a first movable portion 120 movably coupled to the first side rail 110 and a second movable portion 122 movably coupled to the second side rail 112. Each of the first and second movable portions 120, 122 may be movable with respect to the first and second side rails 110, 112 in directions toward and away from the forward end region 102 and the interface end region 104 parallel to the carrier axis 101.

As described herein, the movable portions 120, 122 may be toollessly couplable to the device 12 in many different ways. In the embodiment depicted, each of the movable portions 120, 122 defines a plurality (e.g., two) of device connection posts 126 that are insertable into, or positionable within, corresponding openings in the device 12 to facilitate the toolless coupling of the first and second movable portions 120, 122 to the device 12. In one example, when the carrier 100 unwrapped (or in an unwrapped configuration) prior to attachment of the device 12 within the carrier 100, each of the movable portions 120, 122 may be positioned in either the device interface position as shown in FIG. 5A or the adapter interface position as shown in FIG. 5B. Then, the device 12 may be toollessly coupled to the first movable portion 120 by positioning the device connections posts 126 of the first movable portion 120 into the corresponding openings of the device 12, and then the second side rail 112, the second movable portion 120, and the rear portion 108 may be pivoted around the first side rail 110 such that the forward end region of the second side rail 112 can be coupled to the forward portion 106 so as to be wrapped around the device 12. In at least one embodiment, when the carrier 100 is configured in the adapter interface position, the interface adapter 20 may be operably coupled to the device 12 prior to the device 12 being toollessly coupled to the first movable portion 110 and the remainder of the carrier 100. Further, the interface adapter 20 may also be described as being toollessly coupled to the carrier 100 using the interface adapter supports 118.

As described herein, the movable portions 120, 122 may be movably coupled to the side rails 110, 112. It is to be understood that this disclosure contemplates many various ways that the movable portions 120, 122 may be movably coupled to the side rails 110, 112 and may move with respect to the side rails 110, 112 and remainder of the carrier 100. In the example depicted herein, each of the side rails 110, 112 defines a slot 116 that extends along at least a portion of the length of the side rails 110, 112 in a direction parallel to the carrier axis 101. The movable portions 120, 122 may further include, or define, a rib portion 127 that extends along at least a portion of the length of the movable portions 120, 122 and may be positioned within the slot 116 which may be best shown in the exploded view of FIG. 4. The coupling of the rib 127 within the slot 116 may restrict the movement of the movable portions 120, 122 in directions other than directions parallel to the carrier axis 101. In other words, the movable portions 120, 122 includes rib portions 127 that may be placed within and may slide along the slots 116 to provide the movement of the movable portions 120, 122 in directions parallel to the carrier axis 101. Additionally, such structures may also restrict the movement of the movable portions 120, 122 such that they do not "pop out" of the side rails 110, 112, e.g., in a direction perpendicular to the carrier axis 101. Further, each of the slots 116 may only define a selected length so as restrict motion of the movable portions 120, 122 parallel to the carrier axis 101 in positions beyond either of the device interface position and the adapter interface position.

Additionally, the movable portions 120, 122 and the side rails 110, 112 may include various elements, portions, and/or structures such that when carrier 100, and thus, the movable portions 120, 122, are configured in the device interface position and the adapter interface position, the movable portions 120, 122 may be restricted from moving out of such configuration unless, e.g., user desires to change the position or configuration. In other words, when the carrier 100 is configured in the device interface position, the movable portions 120, 122 may be restricted from moving to configure the carrier 100 into the adapter interface position, and likewise, when the carrier 100 is configured in adapter interface position, the movable portions 120, 122 may be restricted from moving to configure the carrier 100 into the device interface position. A user may deflect, or depress, one or more portions of the movable portions 120, 122 and/or side rails 110, 112 to release the move the movable portions 120, 122 from being restricted such that the user may move the movable portions 120, 122 to configure the carrier 100 into another position or configuration. For example, the carrier 100 may be configured in the adapter interface position as shown in FIGS. 3A-3I, and a user may desire to change the carrier 100 into the device interface position. To do so, the user may release the movable portions 120, 122 from be restricted from movement with respect to the side rails 110, 112, and then move the movable portions 120, 122 with respect to the side rails 110, 112 to configure the carrier into the device interface position. Once in the device interface position, the movable portions 120, 122 may once again be restricted from movement.

Figure 2G:
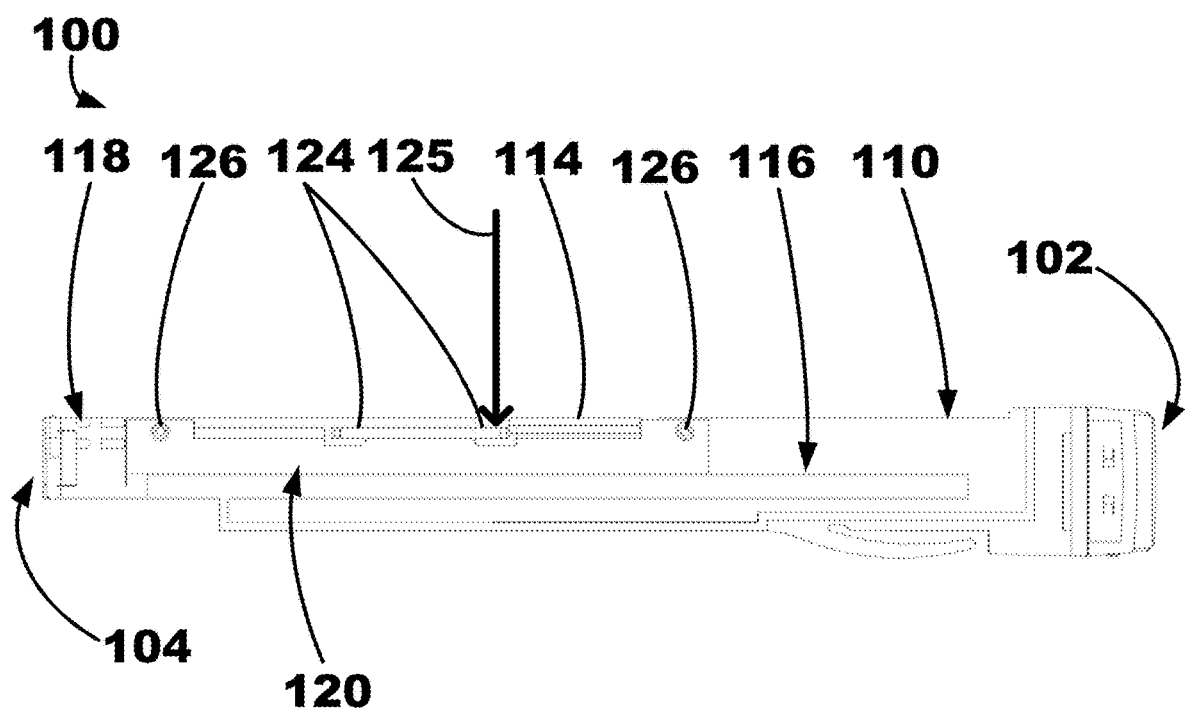
FIG. 2G is a side cross-sectional view of the carrier taken across line A-A' of FIG. 2F.

To provide such restriction and release functionality in the embodiment depicted herein, each of the side rails 110, 112 further includes a restriction tab 114 to restrict the movement of the movable portions 120, 122 between the device interface position and the adapter interface position. Correspondingly, each of the movable portions 120, 122 include deflectable tabs 124 to abut (e.g., contact, directly contact, touch, be adjacent to, etc.) the restriction tabs 114 to restrict the movement of the movable portion 120, 122 between the device interface position and the adapter interface position. The deflectable tabs 124 may deflectable (e.g., depressed, pushed, etc.) in a direction as indicated by arrow 125 in FIGS. 2G and 3I (e.g., due to the cantilever structure of the deflectable tabs 124) to release the movable portions 120, 122 from being restricted by the restriction tabs 114 of the side rails 110, 112. More specifically, when the deflectable tabs 124 are deflected in the direction indicated by arrow 125, the deflectable tabs 124 and other parts of the movable portions 120, 122 may slide underneath (e.g., underneath as depicted in FIG. 2G) the restriction tabs 114 such that the movable portions 120, 122 may move in a direction parallel to the carrier axis 101.

More specifically, when carrier 100 and the movable portions 120, 122 are configured in the adapter interface position, the restriction tabs 114 and the deflectable tabs 124 may restrict movement of the movable portions 120, 122 toward the interface end region 104. Conversely, when carrier 100 and the movable portions 120, 122 are configured in the device interface position, the restriction tabs 114 and the deflectable tabs 124 may restrict movement of the movable portions 120, 122 toward the forward end region 102.

In the preceding description, reference is made to the accompanying set of drawings that form a part hereof and in which are shown by way of illustration several specific embodiments. It is to be understood that other embodiments are contemplated and may be made without departing from (e.g., still falling within) the scope or spirit of the present disclosure. The preceding detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise. As used herein, "or" is generally employed in its sense including "and/or" unless the content clearly dictates otherwise. As used herein, "have," "having," "include," "including," "comprise," "comprising," or the like are used in their open-ended sense, and generally mean "including, but not limited to."

Embodiments of the systems, carriers, and carrier apparatus are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A system comprising:
   a carrier to receive a device and extending from a forward end region to an interface region, the interface region comprising one or more interface adapter supports to receive an interface adapter; and
   a plurality of different interface adapters to adapt a device interface of the device to an adapter interface different than the device interface, each of the interface adapters positionable between the device and the interface region to allow operable coupling of the adapter interface to a corresponding interface of an enclosure that receives the carrier.

2. The system of claim 1, wherein the interface adapter to is toollessly couplable to the carrier using the one or more interface adapter supports.

3. The system of claim 1, wherein at least one of the plurality of different interface adapters adapts a single-ported SATA drive interface to a dual-ported SAS interface.

4. The system of claim 1, wherein the carrier comprises one or more movable portions couplable to the device to allow the device to move between at least a device interface position and an adapter interface position, wherein, when in the device interface position, the device interface is positioned proximate the interface region to allow operable coupling of the device interface to a corresponding interface of an enclosure that receives the carrier, wherein, when in the adapter interface position, the device interface is positioned apart from the interface region to allow an interface adapter to be positioned between the device and the interface region.

5. The system of claim 4, wherein the carrier further comprises a first side rail and a second side rail spaced apart from the first side rail to receive the device therebetween, wherein the first and second side rails extend from the forward end region to the interface end region, wherein each of the one or more movable portions are movably coupled to one of the first and second side rails to allow the device to move towards or away from the interface end region.

* * * * *